United States Patent [19]

Takeno

[11] Patent Number: 5,025,176
[45] Date of Patent: Jun. 18, 1991

[54] PEAK LEVEL DETECTION CIRCUIT
[75] Inventor: Minoru Takeno, Yokohama, Japan
[73] Assignee: Fujitsu Limited, Kawasaki, Japan
[21] Appl. No.: 472,151
[22] Filed: Jan. 30, 1990
[30] Foreign Application Priority Data Jan. 31, 1989 [JP] Japan .................................. 1-21318

[51] Int. Cl.$^5$ .............................................. H03K 5/153
[52] U.S. Cl. .................................... 307/351; 307/359
[58] Field of Search ........................ 307/350, 351, 359

[56] References Cited

U.S. PATENT DOCUMENTS 3,508,158 4/1970 Marchese ........................... 307/351

FOREIGN PATENT DOCUMENTS 63-184073 7/1988 Japan .

OTHER PUBLICATIONS

J. E. Cunningham, Jr., "High Speed Peak Detector", IBM Technical Disclosure Bulletin, vol. 21, No. 9, Feb. 1979, pp. 3544-3545.

Primary Examiner—John Zazworsky
Attorney, Agent, or Firm—Armstrong, Nikaido, Marmelstein, Kubovcik, & Murray

[57] ABSTRACT

A peak level detection circuit provided with a peak holding unit used for determining the threshold level for discrimination of the logics "1" and "0" of the received data from the peak level of the received data signals, wherein even if after a first input pulse train with a peak level of $V_{in1}$ is received, a second input pulse train having a peak level of $V_{in2}$ lower than $V_{in1}$ is received, it is made possible to immediately discriminate the logics "1" and "0" of the second input pulse train by detecting the appearance of the second input pulse train, then immediately pulling down the $V_{in1}$ which is held.

11 Claims, 5 Drawing Sheets

PEAK LEVEL DETECTION CIRCUIT

BACKGROUND OF THE INVENTION

1. Field of the Invention

The present invention relates to a peak level detection circuit for detecting the peak level of a pulse train of alternative mark inversion (AMI) signals etc.

A peak level detection circuit must be able to quickly follow and detect the peak level of an input pulse train even when the peak level changes along with time.

2. Description of the Related Art

In a data transmission and reception system, when transmitting data comprised of the logic "1" and "0" from one data terminal equipment to another data terminal equipment, the other data terminal equipment discriminates the "1" or "0" of the received data in accordance with whether the peak level of the pulses of the received input pulse train is higher or lower than a predetermined threshold level. In this case, the peak level of the pulses varies over time, so it is necessary to make the above-mentioned threshold level higher or lower in accordance with the variation in the high or low changes of the peak level.

Therefore, the peak level of the pulses of the input pulse train is continually monitored so as to set a threshold level conforming with the peak level (for example, ½ of the peak level). For this, a peak level detection circuit is required for detecting the peak level of the pulses of the input pulse train.

In the past, this peak level detection circuit, as will be explained in detail later, received one series of input pulse trains at the data terminal equipment then received another series of input pulse trains after a while. In that case, there was a problem when the peak level of the pulses of the latter input pulse trains was lower than the peak level of the pulses of the former input pulse trains. The problem was that the peak level detection circuit would end up detecting a mistaken peak level in the considerably long time from when the latter pulse trains began to be received. Therefore, data error would occur during that time.

SUMMARY OF THE INVENTION

Therefore, the object of the present invention is to provide a peak level detection circuit which can quickly follow fluctuations in the peak level and correctly detect the peak level even in cases where the peak level of an input pulse train fluctuates over time.

To achieve the above object, the present invention includes a first device, second device, and third device, the first device holding the peak level of the pulses of the input train in an internal capacitor and using that peak level as output for a peak level detection circuit, the second device generating a pulse detection signal showing if the pulses of the input pulse train exist or do not exist, and the third device monitors the pulse detection signals and, when an input pulse train appears, reducing the last peak level held in the capacitor.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the related art and the disadvantages therein will be described with reference to the related figures.

Figure 1:
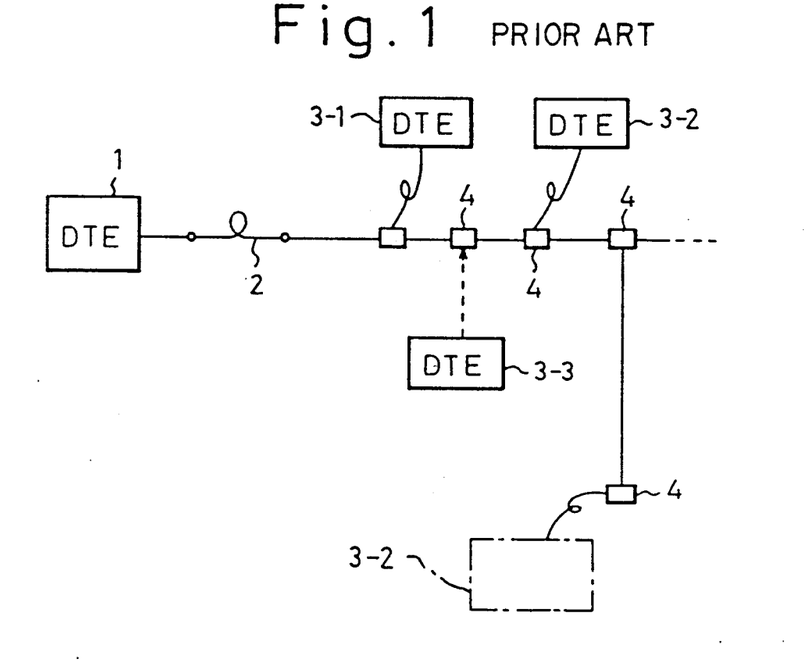
FIG. 1 is a schematic view of one example of a data transmission and reception system.

FIG. 1 is a schematic view of one example of a data transmission and reception system. In the figure, reference numeral 1 is an external data terminal equipment (DTE) which sends and receives data through a main wire 2 to and from, for example, a data terminal equipment group 3 in an office building. As the data terminal equipment group 3, the data terminal equipment 3-1, 3-2, etc. are shown. A plug (not shown) for connecting to a data plug socket 4 is provided with each data terminal equipment. The data terminal equipment, for example, the data terminal equipment 3-2, receives data from the external data terminal equipment 1 via the main wire 2. The data received is received as an input pulse train in the data terminal equipment 3-2. To discriminate if the data of the input pulse train is "1" or "0", use is made of a peak level detection circuit in the data terminal equipment 3-2.

Figure 2:
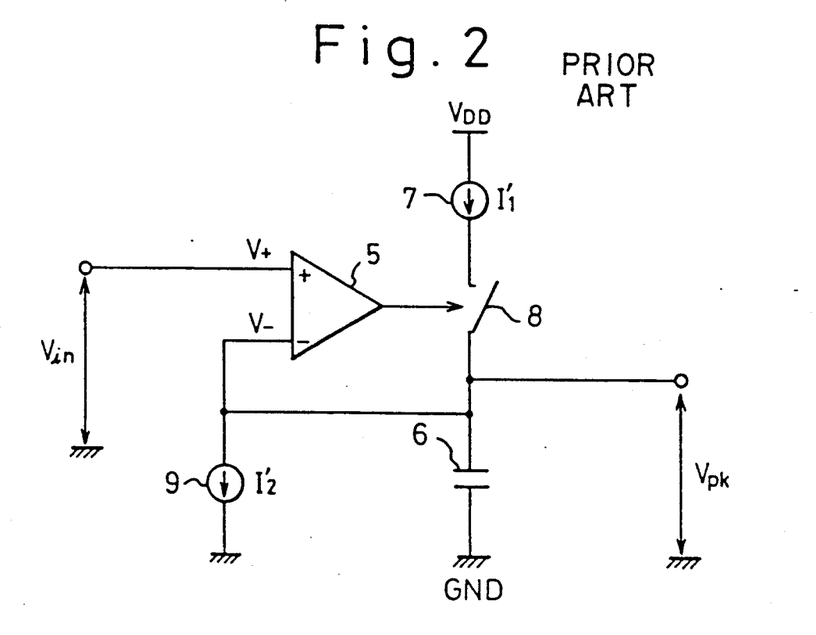
FIG. 2 is a circuit diagram of a conventional peak level detection circuit.

FIG. 2 is a circuit diagram of a conventional peak level detection circuit. In the figure, reference numeral 5 is a comparator, 6 is a capacitor, 7 is a constant current source, 8 is an analog switch, and 9 is a constant current source. The comparator 5 outputs the logic "1" and closes the analog switch 8 when the noninverting input $V+$ is larger than the inverting input $V-$, that is, when $V+ > V-$. At other times, it outputs the logic "0" and opens the analog switch 8.

Figure 3:
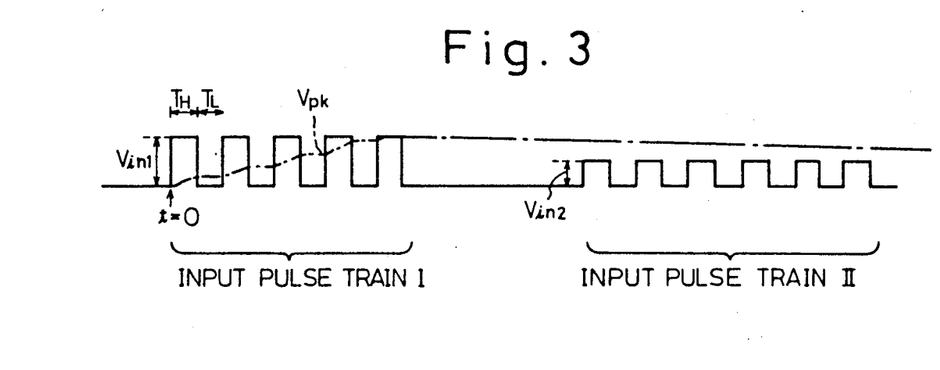
FIG. 3 is a signal waveform diagram for explaining the operation of the conventional peak level detection circuit.

FIG. 3 is a signal waveform diagram for explaining the operation of the conventional peak level detection circuit.

During the period where the peak level $V_{in}$ of the input pulse train is larger than the peak hold level $V_{pk}$ of the peak level detection circuit, the comparator 5 of FIG. 2 outputs "1" and closes the analog switch 8, whereby the capacitor 6 is charged by a constant current $I'_1$ from the constant current source 7 and the terminal voltage, i.e., the peak hold level $V_{pk}$, is gradually increased.

On the other hand, in the period where $V_{in} < V_{pk}$, the comparator 5 outputs the logic "0" and opens the analog switch 8, whereby the charging of the capacitor 6 is stopped, the capacitor 6 is gradually discharged by the constant current $I'_2$ of the constant current source 9, and the peak hold level $V_{pk}$ falls. Therefore, when the input pulse train disappears, the peak hold level $V_{pk}$ slowly approaches zero by a time constant determined by the discharge current $I'_2$.

The peak hold level $V_{pk}$ may be indicated by the following equation:

$$V_{pk} = \{I'_1 \times T_H - I'_2 \times (n-1) \times T_L\}/C$$

where $V_{pk} < V_{in}$, C is the capacitance of the capacitor 6, $T_H$ is the pulse width of the pulses of the input pulse train, $T_L$ is the interval between one pulse and another, and n is the number of the pulses.

Next, a detailed explanation will be made of the aforementioned problem. The input pulse train to be detected does not always have a constant peak level. For example, as shown in FIG. 3, there are times when one series of input pulse trains is applied and then another series of input pulse trains with a different peak level is input. Refer again now to FIG. 1. Assuming the case of data (input pulse train) from the data terminal equipment 1 being received by the data terminal equipment 3-2, the input pulse trains received by the data terminal equipment 3-2 may be shown, for example, by the input pulse train I of FIG. 3.

However, after this, assume another data terminal equipment, for example, the data terminal equipment 3-3, is plugged into the data plug socket 4. If so, the input pulse train received by the data terminal equipment 3-2 changes as shown by the input pulse train II of FIG. 3 and the peak level drops. This is due to the insertion of the data terminal equipment 3-3, which causes the line impedance to increase.

The above change from the input pulse train I to the input pulse train II may occur even under other conditions. For example, there is the case where the data terminal equipment 3-2 is moved to a location of the data plug socket 4 further away.

In such a case, the peak level detection circuit must be able to quickly follow and detect the peak levels $V_{in1}$ and $V_{in2}$ of the input pulse train I and the input pulse train II.

In this case, if the peak level $V_{in2}$ of an input pulse train received subsequently is greater than the peak level $V_{in1}$ of the input pulse train received just before, the peak level detection circuit can quickly detect the peak level $V_{in2}$ of the subsequent input pulse train II.

However, if the peak level $V_{in2}$ of the subsequent input pulse train II is smaller than the peak level $V_{in1}$ of the former input pulse train I, the peak hold level $V_{pk}$ of the peak level detection circuit falls slowly, so if the succeeding input pulse train II is applied before it sufficiently falls, in the period where the peak hold level $V_{pk}$ falls to the peak level $V_{in2}$ of the subsequent input pulse train II, the peak level detection circuit will continue to output a mistaken peak hold value.

To prevent this, it is possible to increase the discharge current $I'_2$ of the capacitor 6 of FIG. 2 so as to quickly reduce the peak hold level $V_{pk}$. However, in this case, conversely, the speed of increase of the peak hold level $V_{pk}$ slows down, and it becomes impossible to quickly follow the peak level of the input pulse train, so in the end the problem cannot be resolved.

Figure 4:
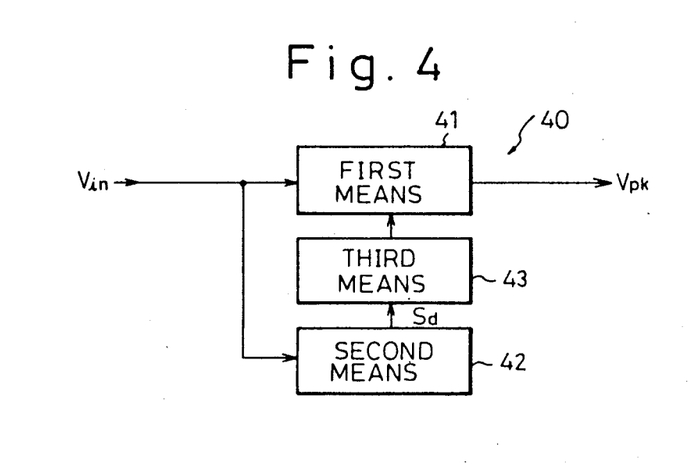
FIG. 4 is a block diagram showing the principle and constitution of the peak level detection circuit according to the present invention.

FIG. 4 is a block diagram showing the principle and constitution of the peak level detection circuit according to the present invention. The peak level detection circuit 40 of the present invention includes a first means 41, second means 42, and third means 43.

The first means 41 successively holds peak levels of pulses of an input pulse train $V_{in}$ by charging or discharging a capacitor in accordance with the peak levels of the pulses of the input pulse train $V_{in}$ and outputs the held peak level as the result of detection of the peak level detection circuit.

The second means 42 detects the peak levels of the pulses of the input pulse train $V_{in}$ and generates pulse detection signals $S_d$ showing if the pulses exist or not.

The third means 43 monitors the pulse detection signals $S_d$ and operates to reduce the last peak level charged in the capacitor each time the input pulse train $V_{in}$ appears.

During the period where the input pulse train $V_{in}$ is input, the appearance of the input pulse train is detected by the second means 42 for input pulse train detection. In accordance with the current and previous peak hold levels, the discharge current of the capacitor of the first means for holding the peak level is set to large or zero by the third means 43 for control. As a result, even when the peak hold level of the first means 41 for holding the peak level is larger than the peak level of the input pulse train, the peak hold level can quickly be reduced and the peak level of the new input pulse train can be followed.

Note that the present invention is remarkably advantageous in the case, as shown in FIG. 3, where there is a change from an input pulse train I with a large peak level to an input pulse train II with a small peak level. In the case of the opposite change (II→I), there is not that great a difference from the conventional peak level detection circuit. Further, while it was stated in the beginning that the present invention uses, for example, an AMI signal as an input signal, in the explanation of the present invention, for simplification, the discussion will be made of a positive pulse. For example, if use is made of an inverting amplifier, for example, the invention may be similarly applied to a negative pulse too.

Figure 5:
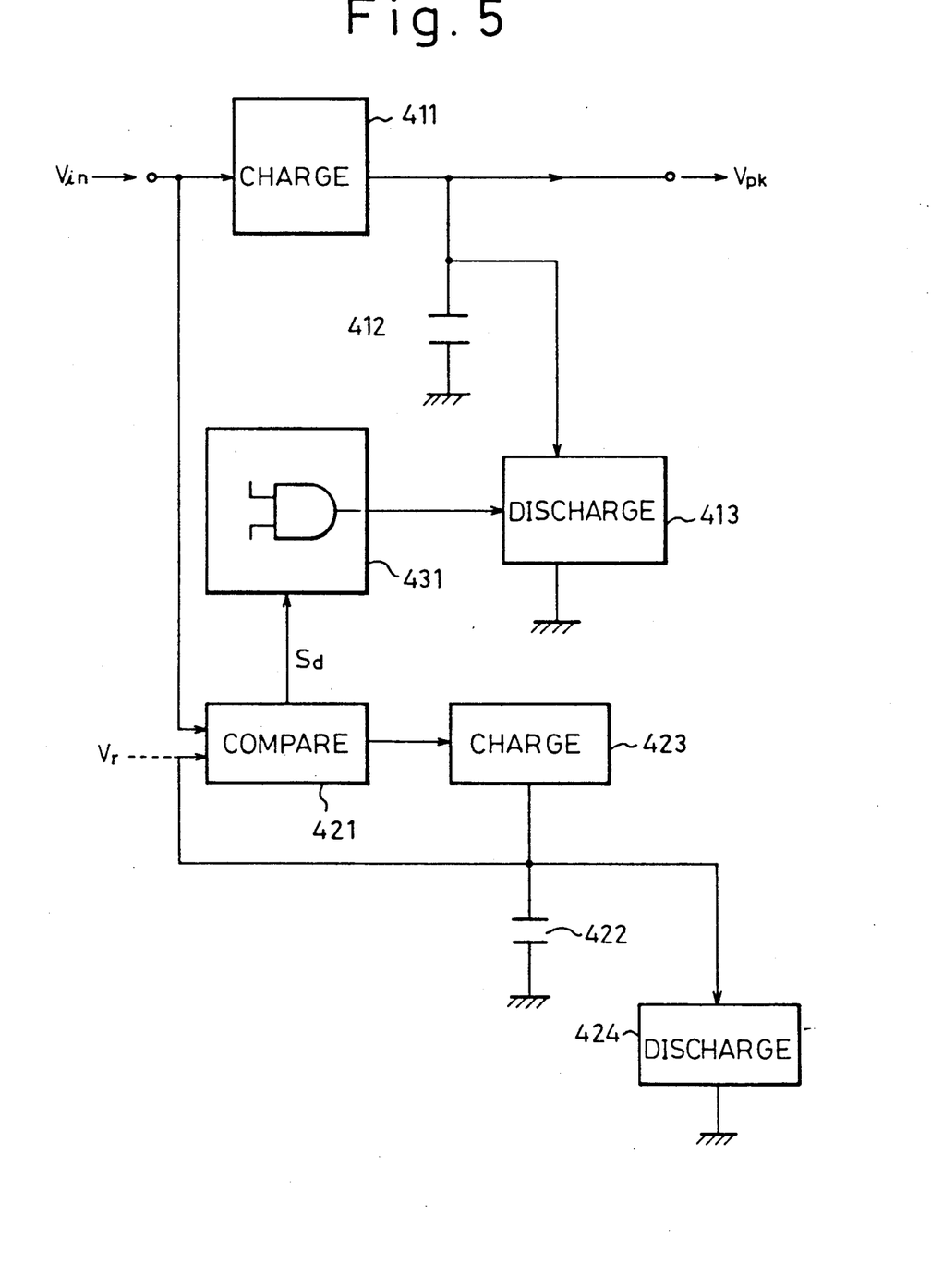
FIG. 5 is a functional block diagram showing in more detail the principle and constitution of FIG. 4.

FIG. 5 is a functional block diagram showing in more detail the principle and constitution of FIG. 4. In the figure, the capacitor 412 in the first means 41 cooperates with the charging unit 411 and discharging unit 413. The third means of FIG. 4, corresponding to logic gate 431 of FIG. 5, monitors the pulse detection signals $S_d$ and makes the discharging unit 413 of FIG. 5 active when the appearance of the input pulse train $V_{in}$ is detected.

The third means 43 has the logic gate 431 which makes the discharging unit 413 nonactive when the charging unit 411 is active.

Figure 7:
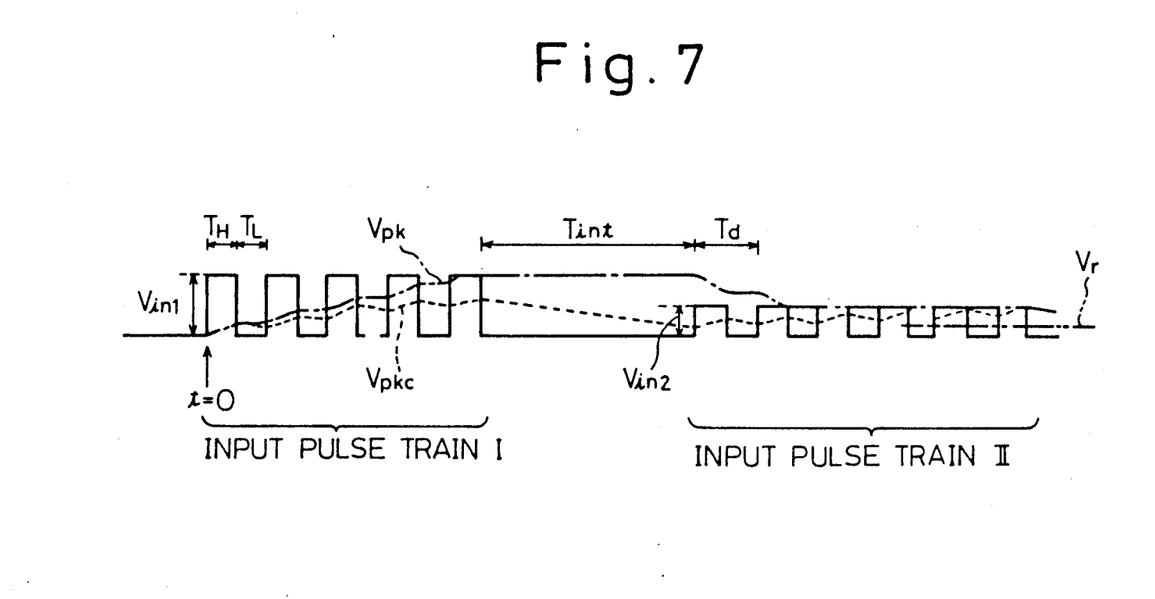
FIG. 7 is waveform diagram for explaining the operation of the peak level detection circuit of FIG. 6.

The second means 42 is constituted by a comparator 421 which receives as a first input the input pulse train $V_{in}$ and receives as its second input a predetermined reference level $V_r$ (FIG. 7). The output of the comparator 421 is used as the pulse detection signal $S_d$.

Alternatively, as an embodiment not using the reference level $V_r$, the second means 42 is comprised of a comparator 421 which is provided with a first input and second input, receives the input pulse train $V_{in}$ at the first input, and outputs the pulse detection signal $S_d$; a capacitor 422 which applies the charging voltage to the second input; a charging unit 423 which charges the capacitor 422 in accordance with the results of the comparison of the comparator 421; and a discharging unit 424 which discharges the capacitor 422.

Figure 6:
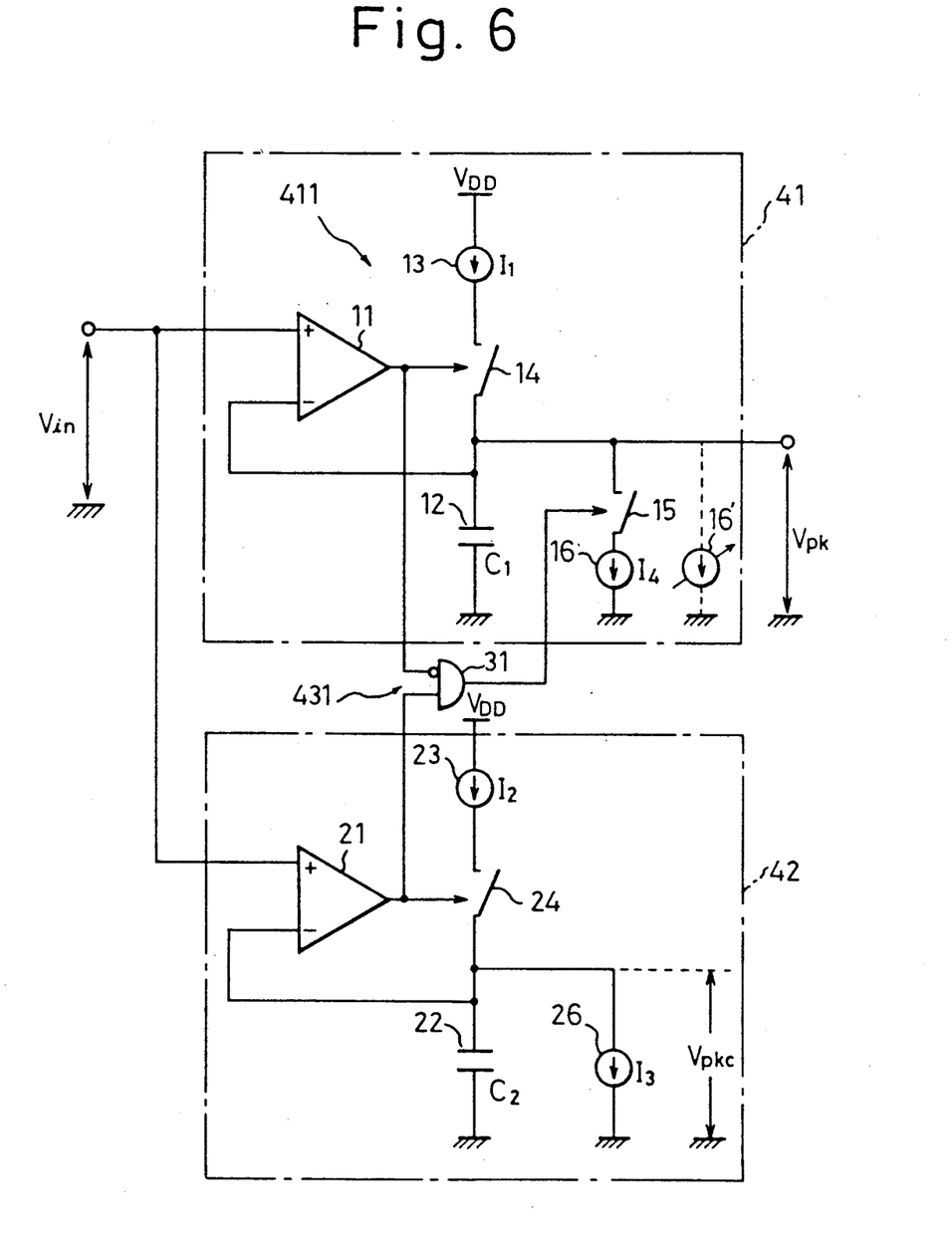
FIG. 6 is a circuit diagram of an example of a peak level detection circuit based on the present invention.

FIG. 6 is a circuit diagram of an example of a peak level detection circuit based on the present invention. First, the correspondence between this figure and FIG. 5 will be clarified.

The charging unit 411 of the first means 41 is constituted by a comparator 11 which receives as its first input the input pulse train $V_{in}$, receives as its second input the peak level held by the capacitor 412 (12 in FIG. 6), and compares the height of the levels of the first input and the second input and a charging switch 14 which turns on or off in accordance with the results of the comparison of the comparator 11 to charge of stop the charging of the capacitor 12.

The logic gate 431 in the third means 43 is constituted by an AND gate 31 which receives as its first input the output of the comparator 11 in the first means 41 and receives as its second input the pulse detection signal $S_d$ from the second means 42.

The discharging unit 453 in the first means 41 is constituted by a discharging switch 15 which turns on or off in accordance with an output logic of the AND gate 31 in the third means 43 and a constant current 16 which is connected in series to the discharging switch 15 and discharges the capacitor 12.

Alternatively, the discharging unit 413 in the first means 41 may be constituted by a constant current source 16'(connected by dotted line in the figure) with a variable constant current for discharging the capacitor 12. The magnitude of the constant current of the constant current source 16' may be made larger or smaller in accordance with the output logic of the AND gate 31.

The charging unit 423 is constituted by a charging switch 24 which is connected in series to the capacitor 422 (22 in FIG. 6) and turns on or off in accordance with the results of comparison of the comparator 21 and a constant current source 23 which charges the capacitor 22 through the charging switch 24.

The discharging unit 424 is constituted by a constant current source 26 which is connected to the capacitor 22.

The constant current value of the constant current source 13 is $I_1$, the constant current value of the constant current source 23 forming the charging unit 423 is $I_2$, and the constant current value of the constant current source 26 forming the discharging unit 424 is $I_3$, the relationship of the magnitudes of the three constant currents $I_1$, $I_2$, and $I_3$ being $I_1 > I_2 > I_3$.

The constitution in FIG. 6 will be explained in further detail below.

$V_{in}$ is the peak level of the input pulse train. Reference numeral 41 is the first means, i.e., the peak holding unit which detects the peak level $V_{in}$ of the input pulse train and outputs it as the peak hold level $V_{pk}$, and 42 is the second means, i.e., the comparison side peak holding unit which detects the peak level $V_{in}$ of the input pulse train in the same way. Reference numeral 431 is the logic circuit which controls the discharge circuit of the peak holding unit 41 in accordance with the state of the peak holding units 41 and 42 and is constituted by an AND gate 31 where one of the inputs is an inverting input.

The peak holding unit 41 is constituted, as mentioned above, by a comparator 11, capacitor 12, constant current sources 13 and 16, and analog switches 14 and 15. Basically, it has the same circuit structure as the circuit explained with reference to FIG. 2. The difference from FIG. 2 is that the constant current source 16 for discharging the capacitor 12 is connected to the capacitor 12 through the analog switch 15, the analog switch 15 being controlled to turn on and off by the AND gate 31. Further, the constant current $I_4$ of the constant current source 16 is set to be sufficiently larger than the constant current $I'_2$ of the circuit of FIG. 2.

The peak holding unit 42 is also basically the same in construction as the circuit in FIG. 2 and as mentioned earlier is constituted by the comparator 21, the capacitor 22, the constant current sources 23 and 26, and the analog switch 24. The difference from FIG. 2 is that the value of the constant current $I_3$ of the constant current source 26 is set to be larger, the discharge speed of the capacitor 22 is large, and the peak holding level $V_{pkc}$ is made to quickly fall.

The output signal of the comparator 11 is led to the inverting input side of the AND gate 31. The output signal of the comparator 21 is led to the other input side.

FIG. 7 is a waveform diagram for explaining the operation of the peak level detection circuit of FIG. 6. The operation of the circuit of the embodiment of FIG. 6 will be explained below with reference to FIG. 7. Assume now that, as illustrated, the input pulse train I is received, then the input pulse train II with a peak level smaller than the input pulse train I is received.

In response to the reception of the input pulse train I, the peak holding unit 41 follows the peak level $V_{in1}$ of the input pulse train, increases the peak holding level $V_{pk}$, and finally outputs a peak holding level $V_{pk}$ equal to the peak level $V_{in}$.

As opposed to this, the peak holding unit 42 increases the peak hold level $V_{pkc}$, but since the discharge current $I_3$ of the peak holding unit 42 is set to be large, the peak hold level $V_{pkc}$ cannot follow the peak level $V_{in1}$ of the input pulse train I as quickly as the peak holding unit 41.

When the reception of the input pulse train I stops, the peak hold level $V_{pkc}$ of the peak holding unit 42 gradually falls. The speed of the fall is faster than that of the conventional peak holding circuit. On the other hand, regarding the peak holding unit 41, since the analog switch 15 is in an open state, the capacitor 12 does not discharge much at all and the reduction of the peak holding level $V_{pk}$ is very slight.

When a new input pulse train II is received at this time, the peak hold level $V_{pkc}$ of the peak holding unit 42 becomes lower than the peak level $V_{in2}$ of the input pulse train II, so the comparator 21 gives the output signal of the logic "1" to the analog switch 24 so as to charge the capacitor 22. At this time, the peak holding level $V_{pk}$ of the peak holding unit 41 is larger than the peak level $V_{in2}$ of the input pulse train II, so the comparator 11 outputs the logic "0". As a result, the AND gate 31 gives an output signal of the logic "1" to the analog switch 15 to close the same. By this, the capacitor 12 is discharged by the constant current $I_4$. The constant current $I_4$ is set to a sufficiently large value, so the peak holding level $V_{pk}$ of the peak holding unit 41 rapidly falls (period $T_d$ in FIG. 7).

If the above operation is continued several times with each pulse input, the peak holding level $V_{pk}$ of the peak holding unit 41 becomes substantially equal to the peak level $V_{in2}$ of the input pulse train II. As a result, the peak hold level $V_{pk}$ of the peak holding unit 41 quickly follows the peak level $V_{in2}$ of the input pulse train II.

The above peak hold level $V_{pk}$ and $V_{pkc}$ may be expressed by the following equations. Here, the input pulse train I is comprised of n number of pulses, while the input pulse train II is comprised of m number of pulses.

$$V_{pkc} = [(I_2 - I_3) \times n \times T_H - I_3 \times \{((n-1) \times T_L +$$

$$T_{int}\} + (I_2 - I_3) \times m \times T_H - I_3 \times (m - 1) \times T_L]/C_2$$

where, $V_{pkc} < V_{in}$.

$$V_{pk} = (I_1 \times n \times T_H - I_3 \times m \times T_H)/C_1$$

where, $V_{pk} < V_{in}$.

Here, $T_H$ is the pulse width of the pulses of the input pulse train, $T_L$ is the interval between one pulse and another, $C_1$ is the electrostatic capacity of the capacitor 12, and $C_2$ is the electrostatic capacity of the capacitor 22.

As clear from the above formula, by suitably setting the values of $I_1$, $I_2$, and $I_3$ and the values of $C_1$ and $C_2$, it is possible to realize a peak level detection circuit which can follow a change in the peak level at any desired speed. However, even though the values of $I_1$, $I_2$, and $I_3$ may be set, the above-mentioned relationship ($I_1 > I_2 > I_3$) is maintained.

In working the present invention, various modifications are possible. For example, in the abovementioned embodiment, in the discharging operation of the capacitor 12 in the peak holding unit 41, the constant current source 16 is cut off by the switch 15 so that no discharge current at all flows during the discharge of the capacitor 12, but the invention is not limited to this. The magnitude of the discharge current of the constant current source 16 can be changed in accordance with the output from the AND gate 31 by direct connection, i.e., without going through the switch 15. This corresponds to the constant current source 16' in FIG. 6.

In the above embodiment, the reception of the input pulse train is detected by the peak holding unit 42, but the invention is not limited to this. It is possible to make things so that the reception of the input pulse train is detected by comparison of the input pulse train with a predetermined reference level and to make things so that the AND gate 31 is controlled by the detection output. This corresponds to $V_r$ in FIG. 5.

As shown in FIG. 7, while the reference level $V_r$ is fixed, the $V_{pkc}$ corresponding to the $V_r$ changes along with the $V_{pk}$. Further, $V_{pkc}$ becomes zero if the reception of the input pulse train is cut off for a while. Therefore, when the peak level of the again received input pulse train is extremely low, it is possible to catch the reception of the input pulse train more reliably when using the $V_{pkc}$ than when using the $V_r$ (since $V_{pkc} < V_r$). Further, if there is entry of noise pulses between pulses during reception of an input pulse train, it is not more liable to catch the noise pulses when using the $V_{pkc}$ than when using $V_r$ (since $V_{pkc} > V_r$).

As explained above, according to the present invention, even when the peak level of the input pulse train changes over time, it is possible to quickly follow the changes in the peak level and correctly detect the peak level.

I claim:

1. A peak level detection circuit comprising:
   a first means for successively holding peak levels of pulses of input pulse trains by charging or discharging a capacitor in accordance with the peak levels of the pulses of the input pulse trains and for outputting the peak levels held as detection results of the peak level detection circuit;
   a second means for detecting the peak levels of pulses of said input pulse trains and for generating a pulse detecting signal which indicates if the pulses exist or not; and
   a third means for monitoring said pulse detection signals from said second means and for controlling said capacitor of said first means such that each time an input pulse train appears, a last peak level charged in the capacitor is reduced.

2. A peak level detection circuit as set forth in claim 1, wherein said capacitor in said first means cooperates with a charging unit and discharging unit, and said third means monitors said pulse detection signals and makes the discharging unit active when an appearance of said input pulse train is detected.

3. A peak level detection circuit as set forth in claim 2, wherein said third means has a logic gate which makes said discharging unit nonactive when said charging unit is active.

4. A peak level detection circuit as set forth in claim 3, wherein said charging unit in said first means is comprised of a comparator which receives as a first input said input pulse train, receives as a second input said peak level held in said capacitor, and compares levels of the first input and second input and a charging switch which turns on or off in accordance with results of the comparison of the said comparator and charges or stops the charging of said capacitor and
   said logical gate in said third means is comprised of an AND gate which receives as a first input an output of said comparator in said first means and receives as a second input said pulse detection signal from said second means.

5. A peak level detection circuit as set forth in claim 4, wherein said discharging means in said first means is comprised of a discharging switch which turns on or off in accordance with output logic of said AND gate in said third means and a constant current source which is connected in series with said discharging switch and discharges said capacitor.

6. A peak level detection circuit as set forth in claim 4, wherein said discharging unit in said first means is comprised of a constant current source with a variable constant current for discharging said capacitor, a magnitude of constant current of the constant current source being switched in accordance with output logic of said AND gate in said third means.

7. A peak level detection circuit as set forth in claim 1, wherein said second means is comprised of a comparator which receives as a first input said input pulse train and receives as a second input a predetermined reference level, an output of said comparator being used as said pulse detection signal.

8. A peak level detection circuit as set forth in claim 1, wherein said second means is comprised of:
   a comparator which is provided with a first input and second input, receives said input pulse train at said first input, and outputs said pulse detection signal;
   a capacitor which applies a charging voltage to said second input;
   a charging unit which charges said capacitor in accordance with results of comparison of said comparator; and
   a discharging unit which discharges said capacitor.

9. A peak level detection circuit as set forth in claim 8, wherein
   said charging unit is comprised of a charging switch which is connected in series to said capacitor and turns on or off in accordance with the results of comparison of said comparator and a constant current source which charges said capacitor through said charging switch and said discharging unit is comprised of a constant current source connected to said capacitor.

10. A peak level detection circuit as set forth in claim 9, wherein said first means is comprised of a comparator which receives as a first input said input pulse train, receives as a second input said peak level held in said capacitor, and compares levels of said first input and said second input, a charging switch which turns on or off in accordance with the results of the comparison of said comparator and charges or stops charging of the capacitor, and a constant current source which charges said capacitor through said charging switch.

11. A peak level detection circuit as set forth in claim 10, wherein a value of constant current of said constant current source in said first means is $I_1$, a value of constant current of said constant current source forming said charging unit in said second means is $I_2$, and a value of constant current of said constant current source forming said discharging unit in said second means is $I_3$ and a relationship of magnitude of the three values of said constant currents $I_1$, $I_2$, and $I_3$ being $I_1 > I_2 > I_3$.

* * * * *